United States Patent
Oswal et al.

(10) Patent No.: US 8,963,607 B1
(45) Date of Patent: Feb. 24, 2015

(54) DC OFFSET CORRECTION WITH LOW FREQUENCY SIGNAL SUPPORT CIRCUITS AND METHODS

(71) Applicant: Texas Instruments Incorporated, Dallas, TX (US)

(72) Inventors: Sandeep Kesrimal Oswal, Bangalore (IN); Eeshan Miglani, Chhindwara (IN); H. Mohammed Shuaeb Fazeel, Bangalore (IN); Pradeep Nair, Bangalore (IN); Anand Hariraj Udupa, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 14/468,009

(22) Filed: Aug. 25, 2014

(30) Foreign Application Priority Data

Aug. 26, 2013 (IN) ............................ 3772/CHE/2013

(51) Int. Cl.
*H03L 5/00* (2006.01)
*H03K 5/003* (2006.01)
(52) U.S. Cl.
CPC ...................................... *H03K 5/003* (2013.01)
USPC .......................................................... 327/307
(58) Field of Classification Search
USPC .......................................................... 327/307
See application file for complete search history.

(56) References Cited

U.S. PATENT DOCUMENTS 7,098,716 B2   8/2006 Ono
2006/0244507 A1* 11/2006 Wu ............................... 327/307

OTHER PUBLICATIONS

"Dynamic Offset Cancellation Technique", Kyoung Tai Chang, Kyunsun Choi, Spring 2011, CSE 577, lecture presentation in PDF format, retrieved from world wide web uniform resource locator http://www.cse.psu.edu/~kyusun/class/cse577/11s/lec/S04AmpOffset.pdf/ on Aug. 25, 2014.

* cited by examiner

*Primary Examiner* — Daniel Rojas
(74) *Attorney, Agent, or Firm* — Alan A. R. Cooper; Frederick J. Telecky, Jr.

(57) ABSTRACT

DC offset correction is provided with low frequency support. A first input terminal for receiving an input signal is selectively coupled to a resistance and a capacitor that are series coupled between the first input terminal and a corresponding output terminal. In a calibration phase, the series resistance is coupled between the input terminal and the capacitor and an average voltage level of the input is stored on capacitor. In a signal processing phase, the charged capacitor is coupled in series between the input terminal and the output terminal while the resistance is bypassed. The output signal obtained contains the high and low frequency components of the input signal, while the DC offset in the input signal is removed from the output signal. A differential circuit and methods are disclosed. Additional embodiments are disclosed.

20 Claims, 6 Drawing Sheets

DC OFFSET CORRECTION WITH LOW FREQUENCY SIGNAL SUPPORT CIRCUITS AND METHODS

RELATED APPLICATIONS

This patent application claims priority to India Provisional Patent Application No. 3772/CHE/2013, entitled "Offset Correction with Low Frequency Signal Support", filed Aug. 26, 2013, which is hereby incorporated in its entirety herein by reference.

TECHNICAL FIELD

The embodiments relate generally to the use of DC offset correction circuits and related methods for providing correction of DC offset in signals. More particularly, the circuits and methods of the embodiments provide DC offset correction that supports low frequency signals. The embodiments provide efficient signal coupling circuits and methods that pass high and low frequency components of an input signal without significant signal attenuation, while simultaneously blocking DC offset components in the input signals from the output.

BACKGROUND

When communication signals are utilized in a system, a filtering function or an offset cancellation function is conventionally used to perform DC offset correction on the received signals. If the DC offset is not removed, certain circuitry coupled to receive the AC components of the signals may have an input voltage limit exceeded, have an overvoltage error, or otherwise not operate properly. The receiving circuit may not be able to use the full dynamic range of the receiver if an unwanted DC offset voltage is present at the input to the receiver.

In one known approach, an RC or high pass filter is used. The high pass filter circuitry may be described as performing an "AC coupling" function in that the output from the high pass filter circuitry should include any time changing signal components that are present in the input signals, the "AC" signals, while removing the DC voltage components. In a conventional approach, a passive filter is often used with a series coupled resistor capacitor circuit to remove the DC portion of the input signals. However, the conventional passive filter approach relies on a high pass filter that also attenuates any low frequency components that are present in the input signal. In an application where a wide frequency band contains needed information in the input signals, the high pass filter removes or significantly attenuates low frequency portions of the signals, and this attenuation results in a loss of information. Further, the low frequency attenuation sometimes also results in unwanted distortion in the output signals.

In another alternative known prior approach, dynamic offset cancellation is used to perform DC offset correction. In this approach, an offset voltage is sampled and stored, for example in a capacitor, during an offset sampling phase. During this offset sampling phase, switches or other control circuitry are used to remove the time varying input signal from the input to the DC correction circuit. In this manner, the output of the DC correction circuit is only the DC offset that is present during the offset sampling phase. The DC offset from the output can be stored by sampling the DC offset onto a capacitor or other storage element, and then during a signal processing phase, the stored offset can be subtracted from the input or from the output signal.

Disadvantages of the prior dynamic offset cancellation approach include that the input signal must be stopped from coming to the inputs or switches used to isolate the time varying input from the circuit during the offset sampling phase. This requirement places additional constraints on the system design. Further the offset voltage that is sampled is restricted to only the DC offset, and cannot include other low frequency components in the input signal, for example. The input signals are not received in the sampling phase so no information about the low frequency components of the input signal are available during the sampling phase.

In one example application, Optical Time Domain Reflectometry, ("OTDR"), the time domain response of a test signal including low frequency signals that include important information about a communications cable. In ODTR, one or more test pulses are transmitted to test the response of a communications cable. In this particular application, the cable is an optical cable. Reflections are then studied to characterize the line and identify any particular problem areas. FIG. 1 depicts an example response curve for an OTDR test. The figure also indicates the physical characteristics of the cable being tested that correspond to certain waveforms in the time domain response.

As shown in FIG. 1, a test apparatus 1 sends a test pulse and plots the response to the test pulse transmitted along an optical fiber. The plot shows attenuation of the test pulse versus distance along the cable. Various events visible in the resulting waveform correspond to different joints, connections, bends, splices or other physical characteristics of the optical fiber. The high frequency components in the signal waveform correspond to faults, bends and/or joints in the optical cable. The low frequency components correspond to signal losses such as "slow droop" and these low frequency signals provide additional information about the nature of the cable, including the cable signal loss rate for certain distances, for example.

In this application, it is important to cancel any DC offset at a receiver, so that the full dynamic range of the receiver circuit can be used. However, if the DC offset correction circuit in the receiver also filters out any low frequency components in the time domain response waveform, the information in the input signal that has components at low frequency, such as the signal droop information, will be lost.

Further, the response of the impulse/step function at the faults such as at joints, bends, or other faults in the optical fiber cable should not have an extended time domain response, as the extended response will spoil detection of nearby faults and joints, or nearby droop. The extended time domain response to impulse signals in the input will mask the waveform changes that are in the input signal due to these events, and since these events are then not visible in the output waveform, this extended time domain response will prevent these events from being observed.

FIG. 2 depicts, for the purpose of explanation, a circuit diagram of a typical prior art high pass filter DC offset correction circuit 10 used for differential signals. In FIG. 2, a positive signal and a complementary signal form a differential signal pair that are received at corresponding input terminals labeled INP and INM. The differential input signals are passed through a passive RC filter that has a symmetrical branch for each of the positive and complementary input signals that are coupled to terminals INP and INM. In FIG. 2, capacitor C1 is shown coupled between the input signal INP and a positive output terminal INPP for outputting the resulting output signal. Resistor R1 is coupled between an input node INCM for receiving a common mode input voltage, and a node N1 between the capacitor C1 and the output INPP.

Similarly, and in a symmetrical arrangement, the complementary input signal at terminal INM is coupled to capacitor C2, which is further coupled to an output terminal INPM for outputting the complementary differential output signal. A second resistor R2 is coupled between another input for receiving the common mode input voltage INCM and a node N2 that is between the capacitor C2 and the output terminal INPM.

The circuit 10 performs a high pass filter function. Circuit 10 will block DC offset in the input signal from the output signal. However, it is very difficult, even impossible, to support low frequency components in the input signals using this kind of prior art filter. The RC filters of circuit 10 not only attenuate the low frequency components of the input signal, but also cause distortion in the output. For example, step response transients take some time to die down in the output waveform. The delay in signal decay will corrupt later transient signals. For this reason, such RC filters are generally considered to be inappropriate for use in applications where low frequency signal support is needed along with DC offset correction.

FIG. 3 illustrates in a voltage waveform graph the response of the prior art pass filter shown in FIG. 2 to an example input signal labeled "INPUT". In FIG. 3, the input signal illustrates a "burst" function switching between 0.0 and 1.0 Volts that occurs between time 0.0 and time 20 microseconds. The input signal INPUT then suddenly stops switching at time 20 microseconds. After that time the input signal INPUT remains at 0 Volts. A common mode input labeled INCM of 0.6 Volts is also shown in this example, and the output waveform labeled OUTPUT in FIG. 3 is approximately centered on this common mode input voltage.

FIG. 3 illustrates some of the problems of the conventional circuit approach (as shown in FIG. 2) for receiving a burst pattern in the input signal. The output voltage OUTPUT tracks the input voltage INPUT until the input waveform stops switching. Then, starting at time 20 microseconds, the output voltage waveform OUTPUT slowly rises towards the input common mode voltage INCM. The constant low voltage shown in the input signal starting at 20 microseconds is lost in the output waveform by the transient response to the stopped input signal, which distorts the output signal OUTPUT and covers up the true voltage (0 Volts after time 20 microseconds) at the input.

FIG. 4 illustrates in another voltage waveform graph a response of the conventional circuit shown in FIG. 2 to a slowly changing input waveform. As seen in FIG. 4, the conventional circuit 10 of FIG. 2 also fails to provide the correct low frequency response needed in this example. In FIG. 4, the input signal labeled INPUT is shown with a step down from about 1.0 Volts at time 0 microseconds to about 0.8 Volts at time 10 microseconds. The input voltage waveform INPUT then slowly falls from 0.8 Volts to 0.7 Volts at time 40 microseconds.

In FIG. 4, the output voltage waveform, again labeled OUTPUT, illustrates the attenuation of low frequency input signals in the conventional filter circuit 10 of FIG. 2. At time 10 microseconds, the output waveform OTUPUT tracks the input waveform, but then the output waveform again slowly rises until the end of the plot. The low frequency input signal that occurs in the input signal INPUT from time 11 microseconds to time 40 microseconds is not reproduced in the output signal OUTPUT. This low frequency information in the input signal is therefore not available for circuits that are coupled to the output of the pass filter 10, because the distortion in the output response masks the low frequency components. The information contained in the low frequency components of the input signal is simply lost. Improvements in DC offset correction circuits and methods for DC offset correction are therefore needed to address the deficiencies and the disadvantages of the known prior approaches.

SUMMARY

Various embodiments disclosed herein provide circuits and methods that advantageously overcome the disadvantages of the DC offset correction approaches of the prior art.

In an embodiment, a DC offset correction circuit includes a first input terminal for receiving an input signal; a first resistance selectively coupled in series to the first input terminal, responsive to a calibration enable signal; and a first capacitor selectively coupled in series to the first resistance responsive to the calibration enable signal, the first capacitor alternatively selectively coupled between the first input terminal and a first output terminal while the first resistance is bypassed, responsive to a signal processing signal. In a further embodiment, the DC offset correction circuit includes a common mode input terminal for receiving a common mode input voltage that is selectively coupled to a first node between the first capacitor and the first output terminal, responsive to the calibration enable signal; and a second common mode input terminal for receiving a common mode input voltage that is selectively coupled to a second node between the second capacitor and the second output terminal, responsive to the calibration enable signal. In still a further embodiment, the DC offset correction circuit further includes a second resistance that is selectively coupled in series to a second input terminal, responsive to the calibration enable signal; and a second capacitor selectively coupled in series with the second resistance responsive to the calibration enable signal, the second capacitor alternatively selectively coupled between the second input terminal and a second output terminal while the second resistance is bypassed, responsive to the signal processing signal.

In another embodiment, a method includes coupling an input signal to a first input terminal, the first input terminal being selectively coupled to a first resistance and the first resistance further series coupled to a first capacitor; receiving a calibration enable signal that indicates a calibration phase is active; during the calibration phase, receiving the input signal into the first resistance and the first capacitor, and charging the first capacitor to an average voltage level of the input signal; receiving a signal that indicates a signal processing phase is active; and during the signal processing phase, coupling the input signal to the first capacitor while bypassing the first resistance, and further coupling the first capacitor to a first output terminal; whereby an output signal at the output terminal contains low and high frequency components of the input signal, while DC components in the input signal are filtered from the output signal. In an additional embodiment, the method above further includes providing a complementary DC offset correction circuit further comprising a second input signal terminal for receiving a second input signal, a second resistance selectively coupled to the second input signal and further series coupled to a second capacitor, and a second output terminal coupled to the second capacitor, during the calibration phase, receiving complementary input signals at the second input and into the second resistance and the second capacitor, and charging the second capacitor to an average voltage level of the second input signal; receiving the signal that indicates a signal processing phase is active; and during the signal processing phase, coupling the second input signal to the second capacitor while the second resistance is bypassed, and the second capacitor coupled to the second output terminal; whereby a second output signal at the second output terminal contains low and high frequency components of the complementary input signal while DC components in the complementary input signal are filtered from the second output signal.

In yet another embodiment, an integrated circuit includes a DC offset correction circuit for receiving a differential input signal, which includes first and second input terminals for receiving a differential input signal comprising a positive input signal and a complementary input signal; a first adjustable resistance selectively coupled to the first input terminal and selectively series coupled to a first capacitor, and a first output terminal coupled to the first capacitor; a second adjustable resistance selectively coupled to the second input terminal and selectively series coupled to a second capacitor, and a second output terminal coupled to the second capacitor; and an analog circuit function coupled to the first and second output terminals and configured to receive a differential output signal corresponding to an AC portion of a differential input signal; wherein the first adjustable resistance is selectively coupled between the first input terminal and the first capacitor and the second adjustable resistance is selectively coupled between the second input terminal and the second capacitor, respectively, responsive to a calibration enable signal; and the first capacitor is series coupled between the first input terminal and the first output terminal, and the second capacitor is series coupled between the second input terminal and the second output terminal, responsive to a signal processing signal. In yet a further embodiment, the integrated circuit includes an analog circuit function that includes a differential amplifier. In still another embodiment the analog circuit function includes an analog to digital converter circuit.

Prior to the discoveries advantageously incorporated in the embodiments, passive filters were considered inappropriate for DC offset correction where low frequency support was required. Problems including the attenuation of low frequency components of the input signals, in combination with the distorted response for impulse or step functions that occurred in the time domain output response, made accurate reproduction of the low frequency components of the input signal impossible when using the prior known approaches. Recognition that RC passive filters can be calibrated in a calibration phase, and that then the capacitors can be series coupled between the input and output terminals in a signal processing phase without the resistances, surprisingly enables the use of the pass filters of the embodiments to perform DC offset correction. The embodiments are especially advantageous in applications that require support for low frequency components in the input. Use of the embodiments unexpectedly overcomes the disadvantages and deficiencies in the prior known approaches.

BRIEF DESCRIPTION OF THE DRAWINGS

For a more complete understanding of the illustrative embodiments described herein and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of example illustrative embodiments are discussed in detail below. It should be appreciated, however, that the embodiments provide many applicable inventive concepts that can be embodied in a wide variety of specific contexts that are too numerous to be described here. The specific embodiments discussed are merely illustrative of specific ways to make and use the various embodiments, and the examples described and the illustrations provided are for illustrative purposes, and are not to be read so as to limit the scope of the specification, or to limit the embodiments, or to limit the scope of the appended claims.

For example, when the term "coupled" is used herein to describe the relationships between elements, the term as used in the specification and the appended claims is to be interpreted broadly, and is not to be limited to "connected" or "directly connected" but instead the term "coupled" may include connections made with intervening elements, and additional connections including additional elements may be used between any elements that are "coupled". In general, for purposes of this specification and the appended claims, if A is coupled to B, then the value of A is a function of value of B. However, when A is coupled to B as described herein, the value of A can also be a function of something else, in addition to the value of B.

Figure 5:
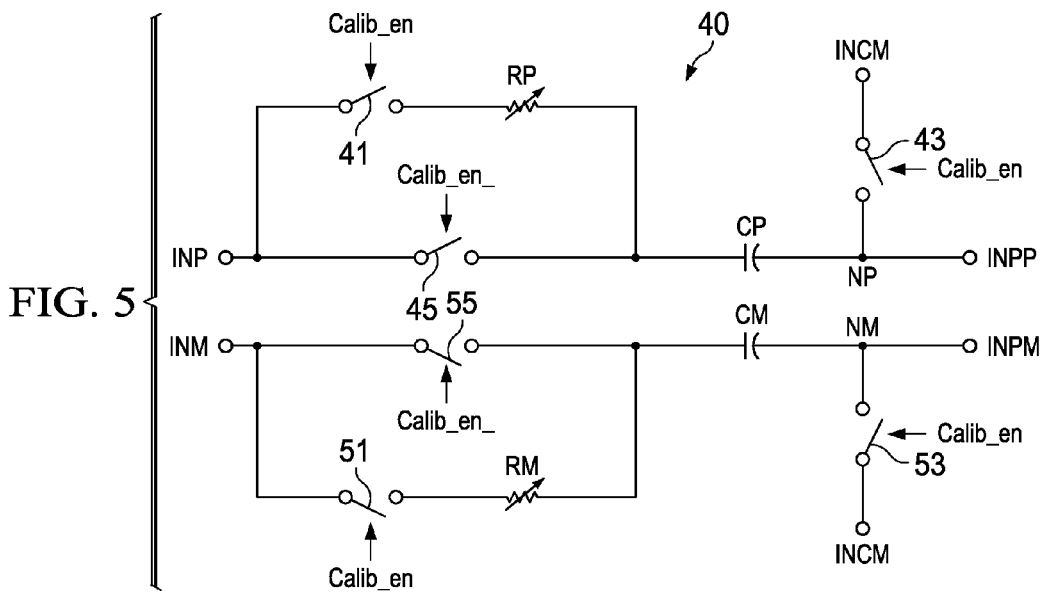
FIG. 5 illustrates in a circuit diagram an embodiment DC offset correction circuit.

FIG. 5 illustrates an embodiment DC offset correction circuit 40 in a simplified circuit diagram. In this non-limiting, illustrative example, a differential circuit embodiment is presented. However, in an additional alternative embodiment that is within the scope of this application and which falls within the scope of the appended claims, a single ended DC offset correction circuit is provided with a single resistance and capacitance coupled between a single input terminal and a single output terminal, and also operating as described below.

In the embodiment illustrated in FIG. 5, a pair of input terminals INP and INM receives the differential input signal as a positive input signal and a complementary input signal.

Each input signal is coupled to a novel filter circuit, the positive and complementary signals passing through a pair of symmetric filter circuits. An adjustable resistance RP selectively receives the voltage at the input terminal INP depending on the state of a switch 41. When switch 41 is closed, the input signal at the input terminal INP is coupled to the resistance RP, which is further series coupled to capacitor CP. The output terminal INPP for the differential output signal is coupled to the capacitor CP. Another switch 43 selectively couples a common mode input terminal INCM to a node NP between the capacitor CP and the output terminal INPP.

In FIG. 5, switch 45 selectively bypasses the resistance RP and when closed, couples the capacitor CP directly to the differential input signal at the input terminal INP. The switch 45 is controlled by a signal processing control signal. This signal can be, for one illustrative example, the inverted calibration enable signal, labeled Calib_en_as shown. Alternatively, the control signal that controls switch 45 to enable signal processing could be produced separately by other control logic, for example (not shown). For a single ended embodiment of the circuit, the resistance RP and the capacitor CP form the DC offset correction circuitry. For the differential circuit embodiment that is presented in the circuit diagram of FIG. 5, a complementary branch of the DC offset correction circuit is also provided between the complementary differential input signal INM and the complementary differential output signal INPM.

The complementary differential input signal received at terminal INM is coupled to a symmetrical filter path that functions in a similar manner to those described above for the positive input signal path. Switch 51 selectively couples the input signal at terminal INM to another adjustable resistance RM. Switch 51 is controlled by the calibration enable signal Calib_en. Resistance RM is then series coupled to the capacitor CM, which is also series coupled to a differential output terminal labeled INPM. Another switch 53 controlled by calibration enable signal Calib_en couples a second common mode input terminal labeled INCM to a node NM that is between the capacitor CM and the output terminal labeled INPM.

Capacitor CM is selectively coupled to a complementary input terminal labeled INM by switch 55, which is controlled by a control signal that indicates a signal processing operation. This signal may be, for example, an inverted form of the calibration enable signal, as shown in FIG. 5, and labeled Calib_en_. Alternatively, the signal processing control signal could be produced separately by control logic (not shown). When switch 55 is closed, the path from the input terminal INP to the resistance RM is bypassed.

Figure 6:
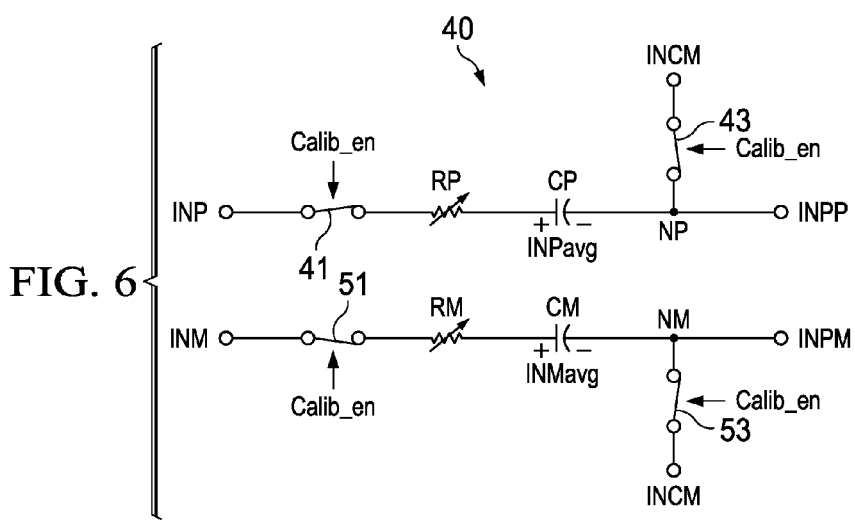
FIG. 6 illustrates in a circuit diagram the embodiment of FIG. 5 in a calibration phase.

In FIG. 6, the embodiment of FIG. 5, circuit 40, is shown when configured in a calibration phase. In FIG. 6, switches 41 and 43 are closed, due to a voltage on the calibration control signal Calib_en; likewise switches 51 and 53 are also closed. Switches 45 and 55 are open (and thus, these switches are not shown in FIG. 6). When the calibration phase is active as indicated by the control signal Calib_en being high, for example, the resistances RP and RM are series coupled between the input terminals INP and INM, respectively, and one plate of the capacitors CP and CM. The other plate of capacitors CP and CM are coupled to the corresponding one of the differential output terminals, labeled INPP and INPM. In addition, during the calibration phase, a common mode input voltage is received at the two terminals labeled INCM and coupled to the node NP between the capacitor CP and the output terminal INPP by the switch 43, and coupled to the node NM between capacitor CM and the output terminal INPM, by the switch 53.

During the calibration phase, the input signals can contain AC signals with high and low frequency components, as well as a DC offset component. The capacitors CP and CM are charged over a calibration time interval to a voltage that is the average input voltage minus the common mode input voltage. These average voltages are illustrated in FIG. 6 as INPavg and INMavg. The average input voltages include the DC offset component. The common mode input voltage INCM is provided by the next stage circuit (not shown) that is coupled to the output terminals INPP and INPM, and this common mode input signal centers the output signals about this input common mode voltage, to allow the full dynamic range of the next stage circuit to be utilized.

Figure 7:
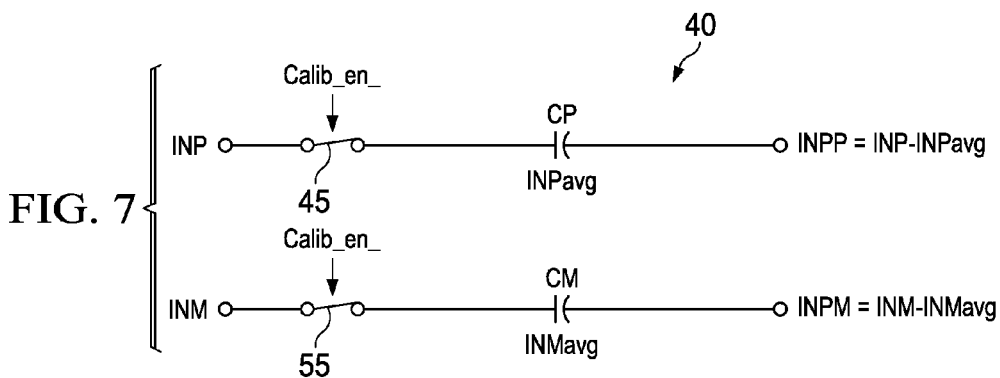
FIG. 7 illustrates in a circuit diagram the embodiment of FIG. 5 in a signal processing phase.

FIG. 7 illustrates the embodiment of FIG. 5, circuit 40, now configured in a signal processing phase. After a calibration phase is completed, the switches 41 and 43 shown in FIG. 5 above will be opened (and thus, these switches are not shown in FIG. 7). This is due to the low voltage on the control signal Calib_en. Switches 51 and 53 are also opened (and are thus not shown.) Switches 45 and 55 are then closed. These switches are controlled by the voltage on another control signal. In this example, the switches 45 and 55 are controlled by an inverted form of the calibration enable signal, labeled Calib_en_in the figures. Other control signals could be produced for controlling the signal processing phase to form additional embodiments as described above.

As shown in FIG. 7, when the circuit 40 is configured in a signal processing phase, the capacitors CP and CM, each now charged to the average input voltage levels, are directly coupled between the input terminals INP and INM, respectively, and the output terminals INPP and INPM, respectively. During the signal processing phase, the resistances RP and RM are not used in the circuit 40, and circuit 40 is now only a coupling capacitor for the positive and complementary signals. The output signals will include both the high and low frequency components of the input signals, or the AC signals, while the DC offset in the input signals are blocked from the output. This is illustrated in FIG. 7 by the mathematical expressions:

INPP=INP−INPavg,INPM=INM−INMavg.

Figure 1:
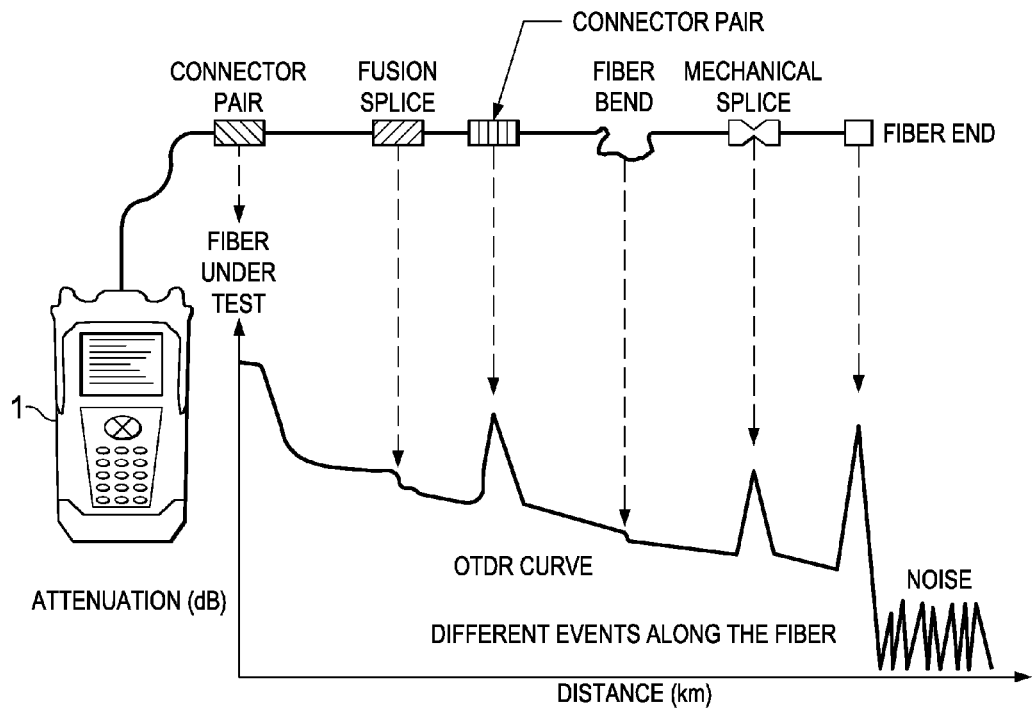
FIG. 1 illustrates in a graph a typical voltage waveform such as seen in an OTDR application.
Figure 2:
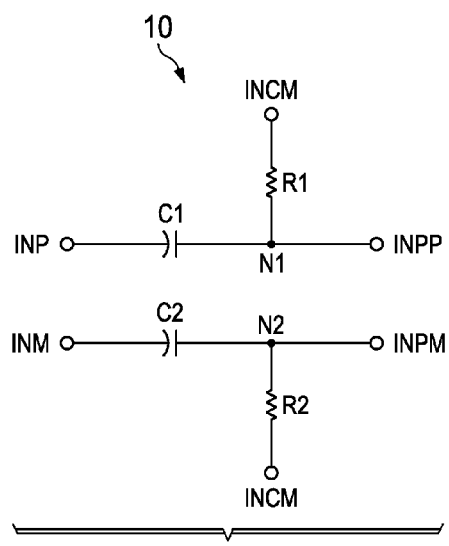
FIG. 2 illustrates in a simplified circuit diagram a prior art high pass filter.
Figure 3:
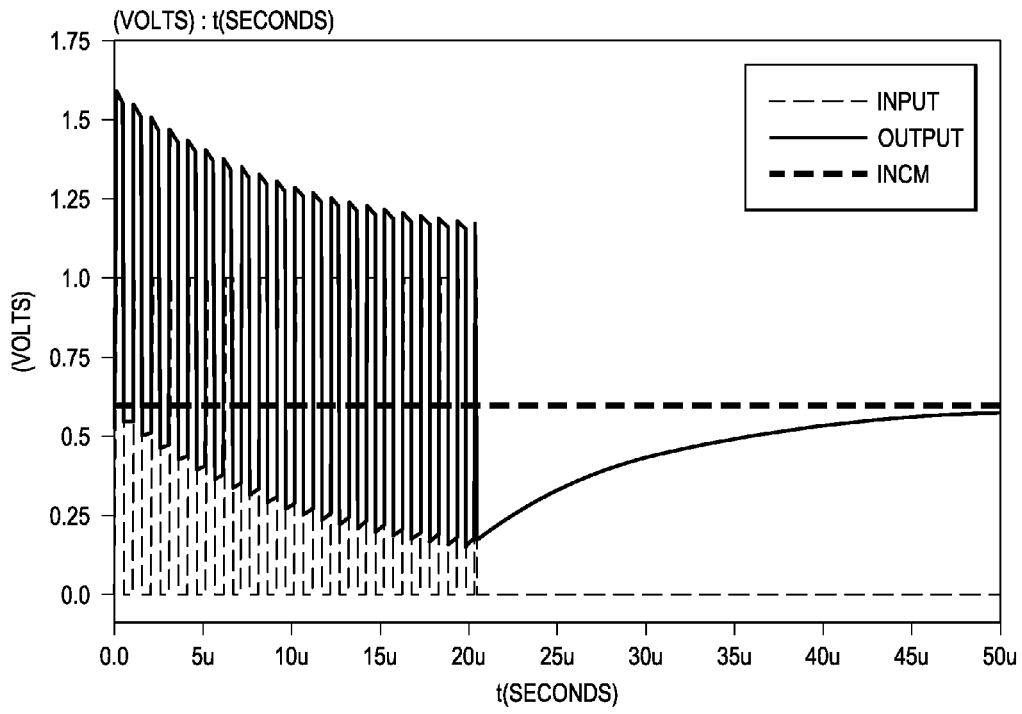
FIG. 3 illustrates in a waveform graph the output of the circuit of FIG. 2 for an example burst input signal.
Figure 8:
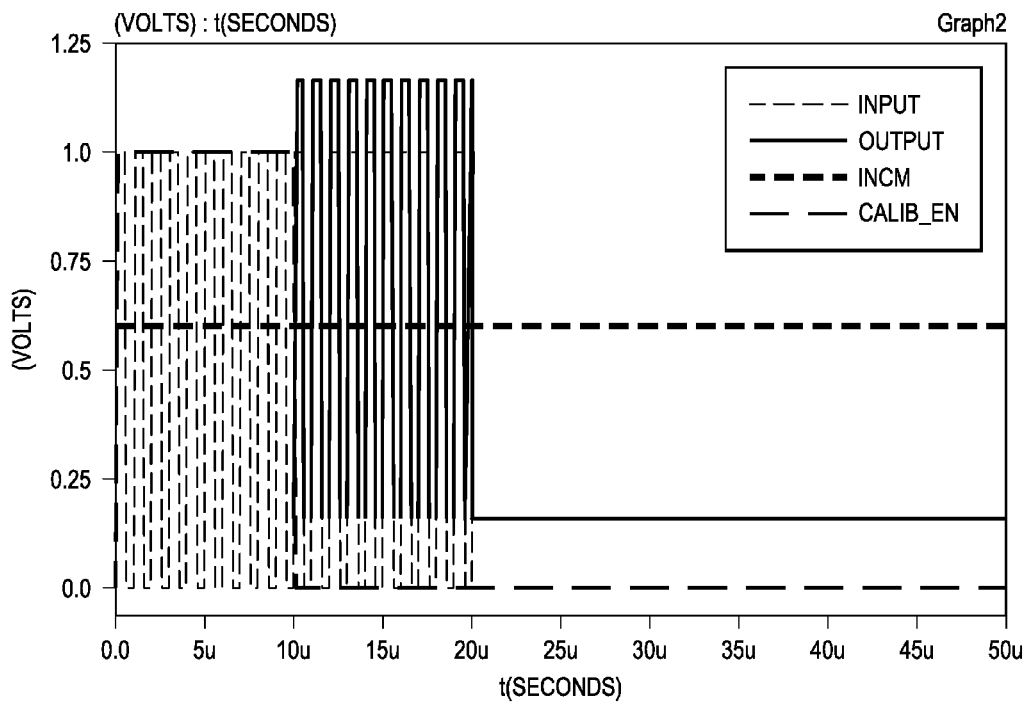
FIG. 8 illustrates in a waveform graph the output of the embodiment DC offset correction circuit of FIG. 5 for a burst input signal.

In FIG. 8, the frequency response obtained by use of the embodiments for the example burst input signal (as is described above with respect to FIG. 3) is shown in a voltage waveform graph. FIG. 8 depicts a calibration phase from time 0 to time 10 microseconds. In the calibration phase, the calibration enable signal Calib_en is at a high voltage. For example, Calib_en may be at a logical "1" voltage, which is greater than a threshold for closing the switches 41 and 51. At time 10, the calibration enable signal Calib_en goes low. At time 20 microseconds, the input signal labeled INPUT suddenly stops switching, as shown in FIG. 3 above.

In FIG. 8, the output signal, labeled OUTPUT, is shown tracking the input signal which is labeled INPUT. At time 10 the calibration phase ends and a signal processing phase begins, because as seen in the graph of FIG. 8, the calibration enable control signal Calib_en falls. The output signal OUTPUT then follows the input signal, switching in the same manner as the input. At time 20, the input signal INPUT falls and stops switching, remaining at 0 Volts. In sharp contrast to the voltage waveforms shown for the conventional high pass filter approaches described above, use of the embodiments provide an output voltage waveform OUTPUT that matches the input waveform, correctly reproducing the "stopped" input voltage at the output at time 20 microseconds, without the distorted waveform that was seen for the prior art circuit in FIG. 3 above. Thus the circuits and methods of the embodiments advantageously provide low frequency input signal support, without the problems of the distortion in the output signals that occurred using the prior art circuits.

Figure 9:
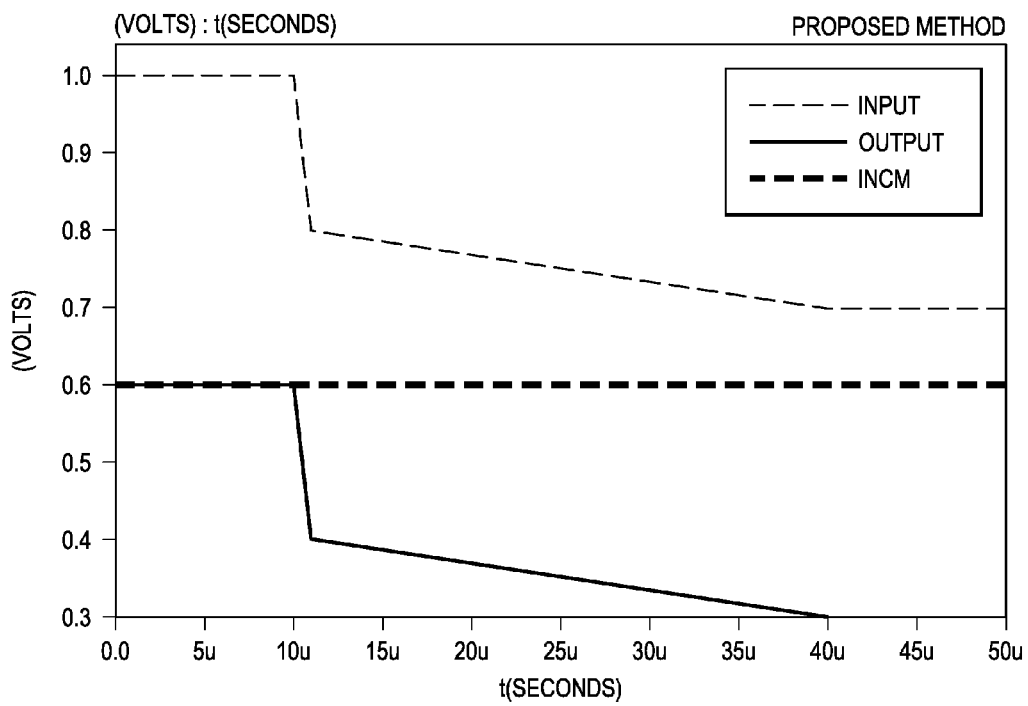
FIG. 9 illustrates in another waveform graph the output of the embodiment DC offset correction circuit of FIG. 5 for a low frequency input signal.

FIG. 9 illustrates in another voltage waveform the output voltage response for the embodiments in the case of a low frequency component in the input signal (such as described above with respect to the graph in FIG. 4). As seen in FIG. 9, the input signal INPUT has a DC step function at time 10 microseconds, followed by a slow droop or fall from time 10 microseconds to time 40 microseconds.

Figure 4:
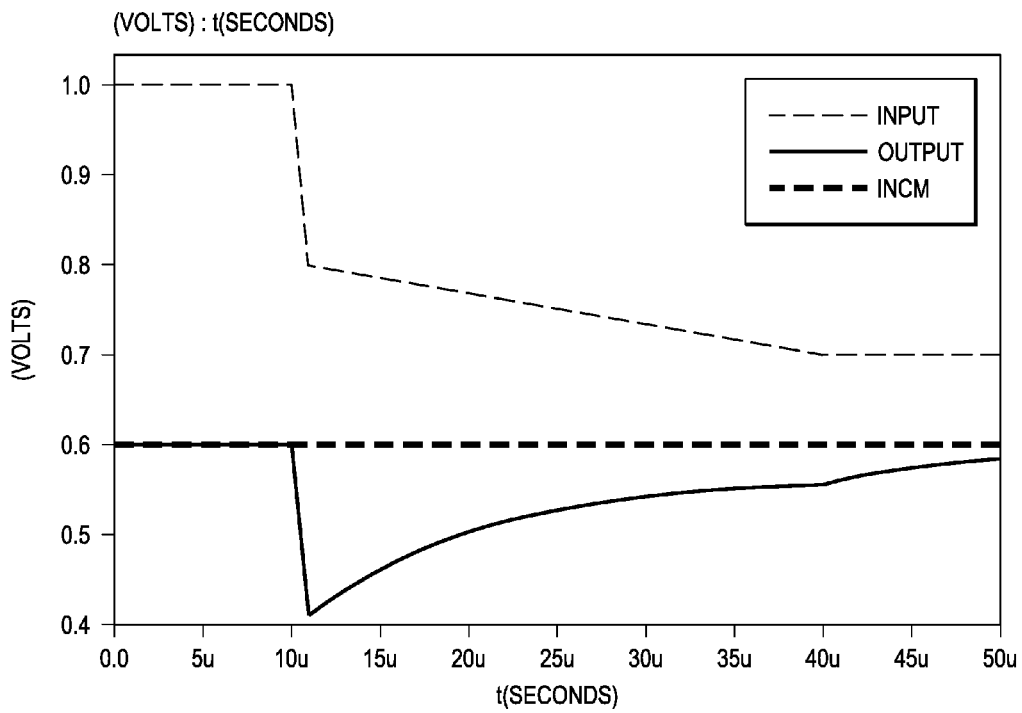
FIG. 4 illustrates in a waveform graph the output of the circuit of FIG. 2 for an example low frequency input signal.

In sharp contrast to the voltage waveform of FIG. 4, which illustrates the low frequency distortion seen in the output waveform for the prior art circuits, the use of the embodiment circuits and the embodiment methods advantageously provides an output that accurately reproduces the low frequency input signal. As seen in FIG. 9, at time 10 microseconds the output voltage OUTPUT follows the input step function. Then at the times following the step in the input signal, the output voltage OUTPUT also follows the input signal slowly downwards, without the distorted output seen for the prior art circuits (as shown above in FIG. 4).

Prior to the discoveries disclosed herein and advantageously incorporated in the various embodiments, high pass or passive RC filters were considered inappropriate for applications where low frequency signal support was required. The attenuation of low frequency components of the input signals that resulted from the prior known approaches, in combination with the distorted response for impulse or step functions that occurred in the time domain output response, made accurate reproduction of the low frequency components of the input signal using the prior art circuits and methods impossible. In the embodiments, it is surprisingly recognized that the resistances in an RC filter can be utilized in a calibration phase to charge the capacitors to the DC offset voltage, even while the input signal contains both AC and DC components. Further it is recognized that the resistances can be bypassed during a signal processing phase, using only the capacitors to block the DC offset from the output signals, while still passing both high and low frequency components to the output. Use of the embodiments advantageously allows the use of the pass filters in applications that require support for low frequency components in the input signals, the embodiments overcoming the disadvantages and deficiencies in the prior known approaches.

Note that while the discussion presented above about the example embodiment of FIG. 5 describes a differential input to a DC offset correction circuit that has a differential output, the method and circuitry described can easily be modified to provide a single ended DC offset correction circuit. In this alternative embodiment, a single current path with a resistance and a capacitance are provided and during calibration, the resistance is coupled in series to the capacitor in a manner analogous to the calibration phase described above. After the capacitance in this alternative embodiment is charged to the average value of the input over a calibration time period, the resistance is bypassed and the input is coupled to the charged capacitor, which passes only the differential part of the input signal to the output, filtering the DC components from the signal.

Figure 10:
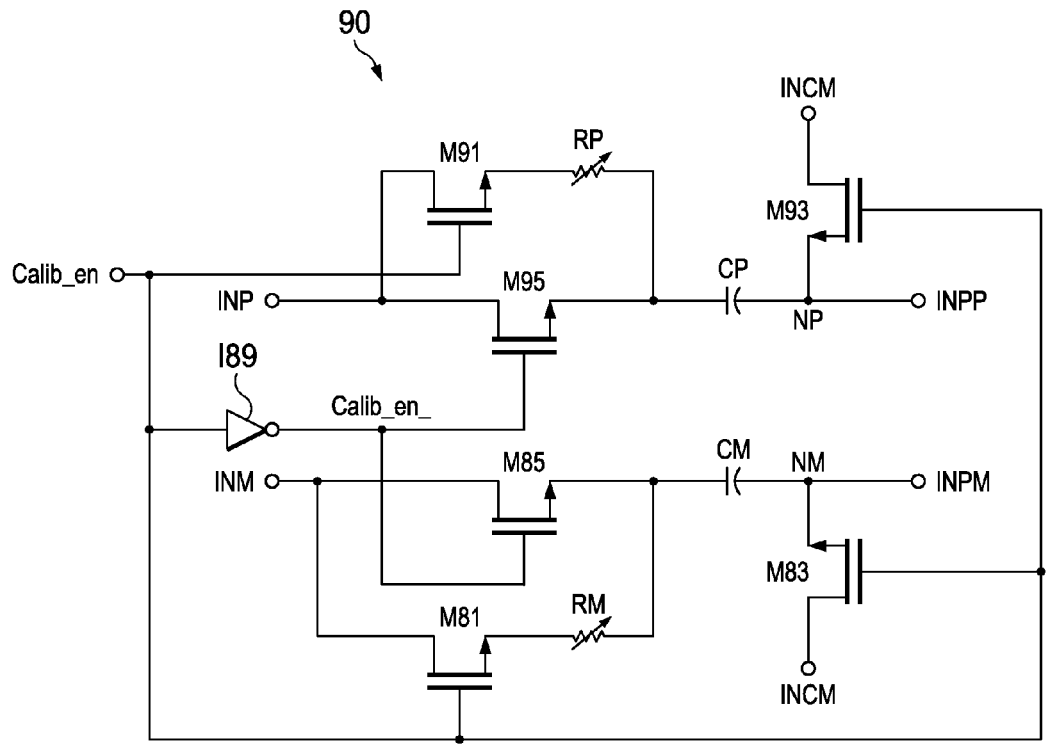
FIG. 10 illustrates in a circuit diagram an embodiment DC offset correction circuit using MOS transistors as switches.

FIG. 10 illustrates a circuit diagram for another embodiment pass filter circuit 90. In this illustrative example implementation, the switches of the embodiment DC offset correction circuit shown in FIG. 5 are each implemented using a MOS transistor as the switch device. In alternative embodiments, other transistors may be used for the switches. Bipolar transistors such as NPN and PNP transistors can be used as the switches to form additional alternative embodiments. P-type MOS transistors can be used instead of N-type MOS transistors. Transmission gates formed of complementary pairs of differing transistor types, such as a P type and an N type MOS transistor coupled in parallel, can be used to form additional alternative embodiments. All of these various embodiments are contemplated as additional embodiments described herein and each of these additional embodiments falls within the scope of the appended claims.

In the particular example circuit implementation shown in FIG. 10, the MOS transistors are each further implemented using an N-type MOS device. However, other MOS transistors can be utilized and the use of these alternative MOS switches forms additional embodiments that are within the scope of the appended claims. Depletion mode and enhancement mode N and P type transistors, bipolar transistors, and other transistors used as switches can be used to form additional embodiments.

In FIG. 10, the differential input signals are received at input terminals INP and INM. The adjustable resistance RP and the capacitor CP are selectively series coupled to the input terminal INP by the current conduction path of MOS transistor M91, which is controlled by the calibration enable signal Calib_en that is coupled to the gate terminal of transistor M91. MOS transistor M93 has a current conduction path that couples the input terminal for the common mode input, INCM, and the node NP between the capacitor CP and the output terminal INPP, which is also coupled to capacitor CP. MOS transistor M93 is controlled by the calibration enable signal Calib_en at its gate terminal. (Note that for an additional alternative embodiment, a single ended DC offset correction circuit can be formed having only resistance RP and capacitor CP coupled between the input node INP and the output node INPP, and operating as described above.)

While the discussion of the embodiments thus far describes the resistances RP and RM as adjustable resistances, in another alternative approach the value required for the resistance (for a single ended DC offset correction circuit embodiment) or the resistances (for a differential circuit embodiment such as is depicted in the figures herein) can be determined in advance, and the resistor value may be fixed. For example, circuit simulation tools such as SPICE or similar circuit simulators and/or circuit design CAD tools may be used to determine the resistance value needed for a particular application. In an alternative embodiment using this approach, the resistances RP and RM can then be provided by fixed value resistors.

In the example embodiment illustrated in FIG. 10, transistor M95 is another N-type MOS transistor with its current conduction path coupling the input terminal INP to capacitor CP. Transistor M95 is controlled by the signal processing control signal Calib_en_at its gate terminal, which is an inverted form of the signal Calib_en. Inverter 189 in FIG. 10 outputs signal Calib_en_and receives the calibration enable signal Calib_en as its input.

Adjustable resistance RM is coupled to the input terminal INM which receives the complementary differential signal by the N-type MOS transistor M81, which has the calibration enable signal Calib_en coupled to its gate terminal. The common mode input terminal INCM is coupled to the node NM between the capacitor CM and the output terminal INPM by the current conduction path of N-type MOS transistor M83, which also has the calibration enable signal Calib_en at its gate terminal.

The capacitor CM is coupled to the input terminal INM by the current conduction path of the N-type MOS transistor M85. Transistor M85 is controlled by the control signal Calib_en_which is coupled to its gate terminal.

In operation, when the calibration enable signal Calib_en is active, or at a voltage that is greater than the threshold voltage Vt for the N-type MOS transistors such as M91, M93, M81, M83, the circuit 90 is in the calibration phase. In the calibration phase, the adjustable resistances RP and RM are series coupled to the corresponding capacitors CP, CM, respectively, which are coupled to the output nodes INPP and INPM, respectively. The voltage at the common mode input terminals INCM is coupled to the nodes NP and NM, as shown in FIG. 10, by transistors M83 and M93, when the calibration enable signal Calib_en is active. In the calibration phase, the capacitors CP and CM are charged to the average input voltage in the corresponding input signal, minus the common mode voltage at the common mode input terminals INCM, as described above. The average voltage in the input signal over a calibration time interval includes the DC offset component in the input signal.

When the calibration enable signal Calib_en falls, the N-type MOS transistors M91, M93, M81 and M83 now have a low voltage at their gate input terminals, and these current conduction paths are inactive. That is, these MOS switches are now "open". At the same time, the inverter 189 will output a high voltage on the control signal Calib_en_. N-type MOS transistors M95 and M85 will then become active, or "close", and the current conduction paths of these MOS transistors will couple the input terminals INP and INM directly to the corresponding capacitors CM and CP. The circuit 90 is then in the signal processing phase, and the output signals will track the input signals, while the DC offset in the input signals is blocked from the output signals by the charged capacitors CM and CP.

Note that when a transistor in the embodiments herein needs to be "closed" or turned on by placing a positive voltage at the gate terminal, a voltage higher than a supply or logic voltage can be used. In this approach, additional alternative embodiments to the embodiments above can be formed by using a bootstrap circuit which couples a previously charged capacitor between a high voltage and the gate terminal to form a voltage at the gate that is higher than the supply voltage, thus speeding the turn on of the transistors and improving circuit performance. When a control signal is described herein as being coupled to the gate of a transistor to turn it on, it is contemplated that in additional embodiments, the coupling path may include additional elements including, for example, a bootstrap circuit. These additional elements form additional alternative embodiments that also fall within the scope of the appended claims.

The signal processing phase can operate correctly for a period of time that lasts until the charge stored on the capacitors CP and CM begins to leak away. The duration of this time is determined in part by the leakage characteristics of the particular physical capacitors used, and in part by the input impedance of the circuitry that is coupled to the output terminals INPP and INPM. In an example application of the DC correction circuit embodiments described above, the circuit coupled to the output terminals may be an analog to digital converter function. A buffer circuit may be placed between the output terminals and the analog to digital converter function. In another example application, the circuit coupled to the output terminals can be an amplifier such as a singled ended or a differential amplifier. Preferably the circuits coupled to the output terminals INP and INM have high input impedance. After a period of time, which can be determined through simple experimentation or by the use of circuit simulators, the charge on the capacitors CP and CM will begin to fall. After that time elapses, the circuit 90 can again be calibrated by raising the calibration enable signal Calib_en to a high value.

The inverted control signal Calib_en_will then fall, ending the signal processing phase, while control signal Calib_en will rise and then cause the circuit 90 to again be in a calibration phase.

In one example implementation of a circuit embodiment, a 180 nanometer minimum feature size semiconductor technology was used to form the components. A low frequency cutoff of 0.2 Hz was achieved. Calibration was performed every 5 milliseconds in this example embodiment. The low frequency corner can be experimentally tested by storing a DC offset in the capacitors, and measuring the droop in the DC offset. In this example implementation a measurement was taken every 5 milliseconds. As described above, the signal processing time that can be used between calibration phases is technology dependent, and is determined by the leakage of the capacitors and the input impedance of the circuitry coupled to the output terminals.

Figure 11:
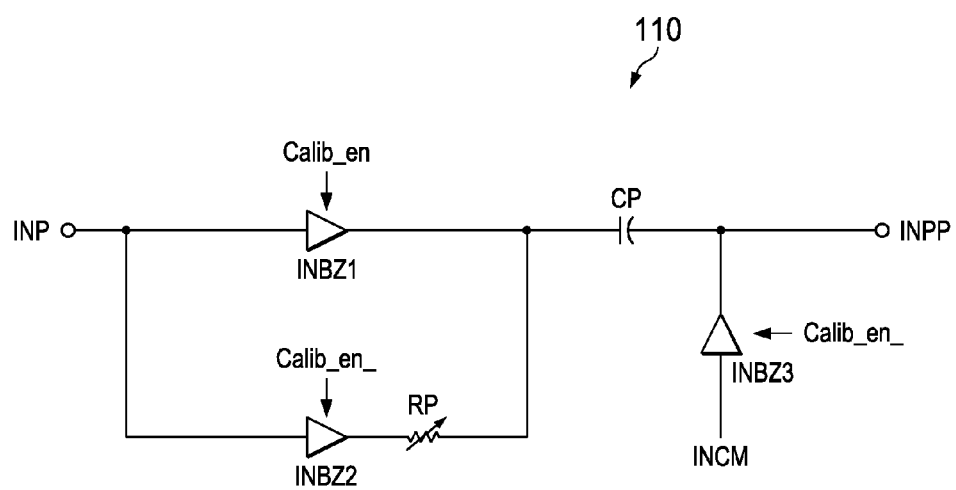
FIG. 11 illustrates in a simplified circuit diagram an alternative embodiment DC offset correction circuit using tri-state buffers to implement the circuit.

FIG. 11 illustrates in a simplified circuit diagram an alternative embodiment implementing a DC offset correction circuit 110 using tri-state input buffers to replace the switches needed in the circuit embodiments presented above. In FIG. 11, a single ended embodiment is shown. Another embodiment is formed in a straightforward manner by creating a differential embodiment implemented using a symmetric complementary circuit and signal path such as in the embodiment of FIG. 5, for example. For simplicity of discussion, only the single ended embodiment is provided in detail here. In FIG. 11, an input terminal INP is provided to receive an input signal including AC or time varying signals and which may include DC signal components; including unwanted DC offset. The input terminal INP is coupled to the input of two tri-state or "high-z" input buffers INBZ1 and INBZ2. Each of these tri-state input buffers has a control signal input. The control signal Calib_en has the same function as in FIG. 5, and when it is a "high" value, the input buffer INBZ1 of FIG. 11 is in high impedance or "tri state" mode. During a calibration phase, when Calib_en is high, the buffer INBZ1 is essentially an open switch, and INP is not passed to the capacitor CP by this input buffer.

At the same time, the control signal Calib_en_, which is a control signal that as is described above is the opposite polarity of Calib_en, is at a "low" value, that is, during calibration phases of operation this signal is low. The tri-state input buffer INBZ2 is then enabled to pass the signals at the input terminal INP to the adjustable resistance RP, which in turn is coupled to one plate of the capacitor CP. The output of the capacitor CP is then coupled to the output terminal INPP.

The input buffer INBZ3 is coupled to an input terminal INCM. When the control signal CALIB_EN_is low, the input buffer IBBZ3 passes a common mode input voltage at terminal INCM to node NP. A common mode input signal, received from the next circuit (not shown) coupled to the circuit in FIG. 11 at terminal INCM, is then placed at the node NP between one plate of the capacitor CP and the output terminal INPP. During the calibration phase, the capacitor CP then is charged to the average input voltage at terminal INP, minus the input common mode voltage, just as described above for the switch embodiments of the DC offset correction circuits.

During a signal processing phase of operation following the calibration phase, the capacitor CP has been now charged to the average input voltage minus the input common mode voltage, as described above. Input buffer INBZ1 is controlled by the control signal Calib_en, which is now a "low" value, and the input buffer INBZ1 is no longer at a tri-state output but passes the signals at the input terminal INP to one plate of the capacitor CP. The resistance RP is not part of the circuit during the signal processing phase, as the input buffer INBZ2 is now in tri-state mode, because the control signal Calib_en_is at a high value during the signal processing phase. That is, as described above, during the signal processing phase the adjustable resistance RP is bypassed by the operation of the tri-state buffer INBZ2. The input buffer INBZ3 is also at a tri-state mode for the same reason, so during the signal processing phase, the signals at the output INPP are passed directly from the input INP through the capacitor CP. The embodiment DC correction circuit 110 of FIG. 11 thus provides a different implementation, while still providing the DC offset correction in the same manner as the DC offset correction embodiment of FIG. 5, for example.

Figure 12:
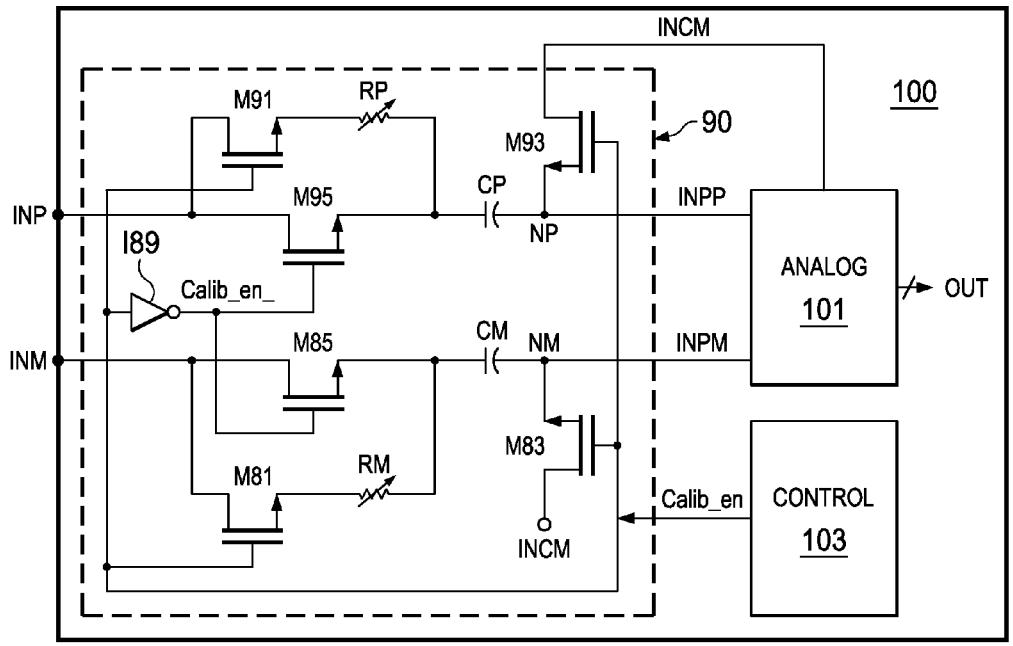
FIG. 12 illustrates in a simplified circuit diagram an embodiment integrated circuit including a DC offset correction circuit.

FIG. 12 depicts in a simplified circuit diagram an example integrated circuit embodiment. In FIG. 12, the circuit 90 as shown in FIG. 10 is formed on an integrated circuit 100, along with an analog function 101 that is coupled to the output terminals INPP and INPM, and a control function 103 that produces, for example, control signal Calib_en. Input terminals INP and INM are external input terminals of the integrated circuit 100. In another alternative embodiment, the circuit embodiment 110 of FIG. 11, using the tri-state buffers, can be used on the integrated circuit 100 instead of circuit 90. Each of these embodiments is contemplated by the inventors as alternative embodiments that fall within the scope of the appended claims.

The operation of the circuitry 90 in the integrated circuit 100 of FIG. 12 is the same as for the other embodiments described above. In one embodiment, the analog function 101 can include be an analog to digital converter and will have a multiple bit digital output that corresponds to a numerical value corresponding to a voltage on the differential input terminals. A buffer (not shown for simplicity) can be used within analog circuit 101 to couple the DC offset correction circuit 90 to the analog to digital converter, for example. In another embodiment, analog circuit 101 can be a single ended amplifier or a differential amplifier, for example.

The embodiments described above further advantageously provide adjustable resistances for use in the calibration phase of operation. By adjusting the resistances the cutoff frequency for the embodiment circuits may be dynamically adjusted. In this manner, for a particular application, additional low frequency signals may be blocked, in addition to the DC offset voltage. The adjustable resistances can be dynamically adjusted during the calibration phase until the desired cutoff frequency is obtained. In one example, signals below 10 MHz in frequency were filtered.

In another example application, the embodiments were used to provide DC offset correction circuitry that accurately reproduced low frequency components in the input signals as low as 0.2 Hz. The embodiments advantageously DC offset correction by blocking the DC offset from the output, while passing low frequency signals to the output without attenuation or distortion, even while using a passive filter circuit. In sharp contrast to the prior known approaches, the embodiments surprisingly allow a passive filter to be used for DC offset correction, while still supporting low frequency signal components. Further, the use of the adjustable resistances in the calibration phase allows the cutoff frequency to be dynamically adjusted to obtain the optimum low frequency response needed for a particular application. In various alternative embodiments that are also described above and which are within the scope of the appended claims, the resistance values can be determined by simulation, for example, and then fixed resistances can be used in the implementation of the circuits.

The embodiments advantageously operate correctly even though the AC signals in the input signals are always present at the input terminal. That is, surprisingly and in sharp contrast to some prior known approaches, the circuit and methods of the embodiments advantageously do not require a direct measurement of the DC components of the input signals. The AC signals can continue to come into the input terminals during the calibration phase without affecting the performance of the embodiments. The embodiments thus provide wide common mode input range without requiring knowledge of what the DC offset levels in the input signal are in advance. In sharp contrast to the prior known approaches, with the use of the embodiments, no "idle" time is needed to directly observe the DC offset levels, which requires placing additional constraints on the system. Use of the embodiments advantageously removes any signal constraints on the input signals.

Figure 13:
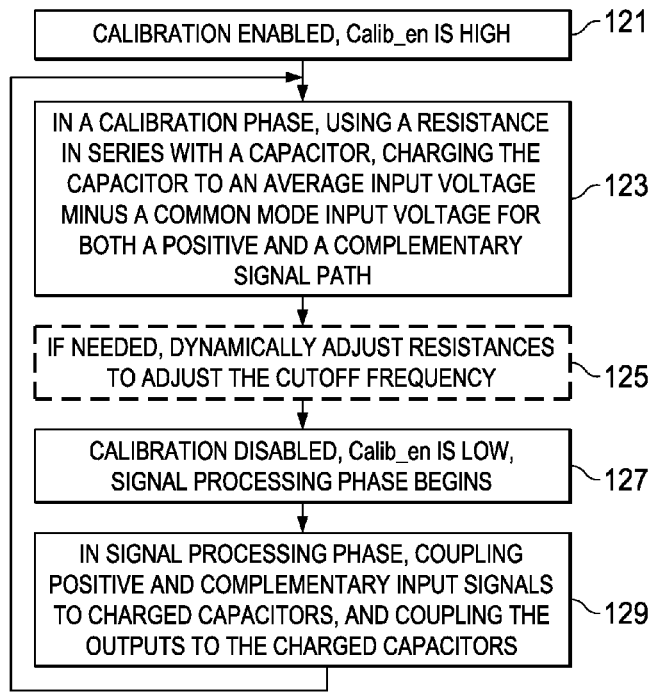
FIG. 13 illustrates, in a flow diagram, a method embodiment for providing DC offset correction.

FIG. 13 illustrates in a flow diagram a method embodiment for providing DC offset correction. In FIG. 13, the method begins at stage 121. The calibration is enabled by raising the control signal, labeled Calib_en in the figures above, to a predetermined level such as a logic "high" level. The method transitions to stage 123, the calibration phase. In the calibration phase, the resistances are series coupled to the capacitors for both the positive and the complementary input signals, and the capacitors are charged to the average input signal voltage. As shown above, this stored average input voltage corresponds to the DC offset voltage in the input signals minus a common mode input voltage.

The method shown in the flow diagram of FIG. 13 then transitions to stage 125. In stage 125, an optional step can be performed. If needed, the adjustable resistances can be dynamically adjusted to provide a desired cutoff frequency and thereby tailor the output response to block low frequency components including the DC offset and including additional low frequency components. If this adjustment is not needed this step can be skipped and not performed as indicated by the "dashed" outline of the box for stage 125. In some of the embodiments fixed value resistors are used, as described above. In other alternative embodiments, the adjustable resistances are used as described above, but these may have been previously adjusted to a desired value and no further adjustment may be needed. In those cases step 125 can be skipped.

The method of FIG. 13 then transitions to stage 127 where the calibration enable signal, Calib_en in the figures above, is lowered. The calibration phase then ends and a signal processing phase begins.

The method of FIG. 13 next transitions to stage 129. In stage 129, the signal processing phase begins, and the input signals are passed directly through the charged capacitors and to then the output terminals. The output signals include both the high and low frequency components of the input signals, as described above, while the DC offset in the input signals is blocked, providing the needed DC offset correction.

The method continues by transitioning back to stage 123 and the calibration phase is again performed. The method continues until the required signal processing is completed and the method then ends. Note that although the method shown in FIG. 13 depicts a positive and complementary signal path, the method can easily be transformed to a single ended signal path, thus forming an additional embodiment.

In contrast to the prior known approaches, the use of the embodiment circuits and methods described herein surprisingly enables the use of passive RC filters to receive input signals and provide DC offset correction, while nevertheless supporting low frequency components in the input signals. Recognition that the resistances in a passive filter can be used in a calibration phase with the capacitors to charge the capacitors, and that during a subsequent signal processing phase, the capacitors may be coupled directly between the input terminals and the output terminals while the resistances are bypassed, advantageously provides embodiments that surprisingly enable DC offset correction with low frequency support, without the previously observed attenuation of the low frequency components of the input signals.

Although the example embodiments have been described in detail, it should be understood that various changes, substitutions and alterations can be made herein without departing from the spirit and scope of the application as defined by the appended claims.

Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding embodiments described herein may be utilized according to the embodiments and alternative embodiments. Accordingly, the appended claims are intended to include within their scope such processes, machines, manufacture, compositions of matter, means, methods, or steps.

What is claimed is:

1. A DC offset correction circuit, comprising:
   a first input terminal for receiving an input signal;
   a first resistance selectively coupled in series to the first input terminal, responsive to a calibration enable signal; and
   a first capacitor selectively coupled in series to the first resistance responsive to the calibration enable signal, the first capacitor alternatively selectively coupled between the first input terminal and a first output terminal while the first resistance is bypassed, responsive to a signal processing signal.

2. The DC offset correction circuit of claim 1, and further comprising:
   a common mode input terminal for receiving a common mode input voltage that is selectively coupled to a first node between the first capacitor and the first output terminal, responsive to the calibration enable signal.

3. The DC offset correction circuit of claim 2, and further comprising:
   a second resistance that is selectively coupled in series to a second input terminal, responsive to the calibration enable signal; and
   a second capacitor selectively coupled in series with the second resistance responsive to the calibration enable signal, the second capacitor alternatively selectively coupled between the second input terminal and a second output terminal while the second resistance is bypassed, responsive to the signal processing signal.

4. The DC offset circuit of claim 3, wherein the first and second resistances further comprise adjustable resistances.

5. The DC offset correction circuit of claim 3 and further comprising:
   the common mode input terminal for receiving a common mode input voltage being coupled to a second node between the second capacitor and the second output terminal, responsive to the calibration enable signal.

6. The DC offset correction circuit of claim 5, wherein the first capacitor is series coupled between the first input terminal and the first output terminal, and the second capacitor is series coupled between the second input terminal and the second output terminal, responsive to a predetermined voltage on the signal processing signal.

7. The DC offset correction circuit of claim 5 and further comprising:
   a first transistor having a current conduction path coupled between the first input terminal and the first capacitor, and having a gate terminal coupled to the signal processing signal; and
   a second transistor having a current conduction path coupled between the second input terminal and the second capacitor, and having a gate terminal coupled to the signal processing signal.

8. The DC offset correction circuit of claim 7, wherein the first and second transistors each further comprise one selected from the group consisting essentially of: N-type MOS transistors, P-type MOS transistors, transmission gates comprising P and N-type MOS transistors coupled in parallel, bipolar transistors, NPN transistors, PNP transistors and combinations thereof.

9. The DC offset correction circuit of claim 7 and further comprising:
   a third transistor having a current path coupled between the first input terminal and the first resistance, and having a gate terminal coupled to the calibration enable signal; and
   a fourth transistor having a current path coupled between the second input terminal and the second resistance, and having a gate terminal coupled to the calibration enable signal;
   whereby the first and second resistances are series coupled between the first and second input terminals, respectively, and the first and second capacitors, respectively, by the current paths of the third and fourth transistors, respectively, responsive to a predetermined voltage on the calibration enable signal.

10. The DC offset correction circuit of claim 9, wherein the third and fourth transistors each comprise one selected from the group consisting essentially of: N-type MOS transistors, P-type MOS transistors, transmission gates comprising N type and P type MOS transistors coupled in parallel, bipolar transistors, NPN transistors, PNP transistors, and combinations thereof.

11. The DC offset correction circuit of claim 10, and further comprising:
   a fifth transistor having a current conduction path coupled between the common mode input terminal and the first node, and having a gate terminal coupled to the calibration enable signal; and
   a sixth transistor having a current conduction path coupled between the common mode input terminal and the second node, and having a gate terminal coupled to the calibration enable signal.

12. A method, comprising:
   coupling an input signal to a first input terminal, the first input terminal being selectively coupled to a first resistance and the first resistance further series coupled to a first capacitor;
   receiving a calibration enable signal that indicates a calibration phase is active;
   during the calibration phase, receiving the input signal into the first resistance and the first capacitor, and charging the first capacitor to an average voltage level of the input signal;
   receiving a signal that indicates a signal processing phase is active; and during the signal processing phase, coupling the input signal to the first capacitor while bypassing the first resistance, and further coupling the first capacitor to a first output terminal;

whereby an output signal at the output terminal contains low and high frequency components of the input signal, while DC components in the input signal are filtered from the output signal.

13. The method of claim 12, and further comprising:
during the calibration phase, dynamically adjusting the first resistance to filter out selected low frequency components of the input signal, in addition to the DC components.

14. The method of claim 12, and further comprising:
providing a complementary DC offset correction circuit further comprising a second input terminal for receiving a second input signal, a second resistance selectively coupled to the second input signal and further series coupled to a second capacitor, and a second output terminal coupled to the second capacitor, during the calibration phase, receiving a complementary input signal into the second resistance and the second capacitor, and charging the second capacitor to an average voltage level of the second input signal;

receiving the signal that indicates a signal processing phase is active; and during the signal processing phase, coupling the second input signal to the second capacitor while the second resistance is bypassed, and the second capacitor being coupled to the second output terminal;

whereby a second output signal at the second output terminal contains low and high frequency components of the complementary input signal while DC components in the complementary input signal are filtered from the second output signal.

15. The method of claim 14, and further comprising:
providing a first switch having a current path coupled between the first input terminal and the first resistance, and having a gate terminal coupled to the calibration enable signal; and providing a second switch having a current path coupled between the second input terminal and the second resistance, and having a gate terminal coupled to the calibration enable signal;

whereby when the calibration enable signal is active indicating a calibration phase, the first resistance and the second resistance are series coupled between the first input terminal and the first capacitor, and the second input terminal and the second capacitor, respectively, by the current paths of the first switch and the second switch, respectively.

16. The method of claim 15, and further comprising:
providing a third switch having a current conduction path coupled between the first input terminal and the first capacitor, and having a gate terminal coupled to the signal processing control signal;

providing a fourth switch having a current conduction path coupled between the second input terminal and the second capacitor, and having a gate terminal coupled to the signal processing control signal; and when a predetermined voltage is received on the signal that indicates a signal processing phase is active, operating the third switch and the fourth switch such that the input signal is coupled to the first capacitor and the complementary input signal is coupled to the second capacitor, respectively, while the first resistance and the second resistance are bypassed.

17. The method of claim 16, and further comprising:
providing a fifth switch having a current conduction path coupled between a common mode input terminal and a first node between the first capacitor and the first output terminal, and having a gate terminal coupled to the calibration enable signal;

providing a sixth switch having a current conduction path coupled between the common mode input terminal and a second node between the second capacitor and the second output terminal, and having a gate terminal coupled to the calibration enable signal; and operating the fifth switch and the sixth switch whereby during a calibration phase indicated by a predetermined voltage on the calibration enable signal, a common mode signal received at the common mode input terminal is coupled to the first node and the second node, respectively, by the current conduction paths of the fifth switch and the sixth switch, respectively.

18. The method of claim 17, wherein providing the first, second, third, fourth, fifth and sixth switches further comprises providing transistors corresponding to each of the switches that each comprise one selected from the group consisting essentially of: N-type MOS transistors, P-type MOS transistors, transmission gates comprising a P-type and N-type MOS transistor coupled in parallel, bipolar transistors, PNP transistors, NPN transistors, and combinations thereof.

19. An integrated circuit, comprising:
a DC offset correction circuit for receiving an input signal, comprising:
a first input terminal for receiving an input signal;
a first resistance selectively coupled to the first input terminal and selectively series coupled to a first capacitor, and a first output terminal coupled to the first capacitor; and
an analog circuit function coupled to the first output terminal and configured to receive an output signal corresponding to an AC portion of the input signal;
wherein the first resistance is selectively coupled between the first input terminal and the first capacitor responsive to a calibration enable signal; and the first capacitor is series coupled between the first input terminal and the first output terminal while the first resistance is bypassed, responsive to a signal processing signal.

20. The integrated circuit of claim 19, wherein the analog circuit function further comprises an amplifier that is one selected from the group consisting essentially of: a single ended amplifier, an analog to digital circuit, and a differential amplifier.

* * * * *